(12) United States Patent
Chaintreuil et al.

(10) Patent No.: US 9,746,528 B2
(45) Date of Patent: Aug. 29, 2017

(54) DETECTION OF ELECTRICAL ARCS IN PHOTOVOLTAIC EQUIPMENT

(75) Inventors: Nicolas Chaintreuil, Montmelian (FR); Vincent Chauve, Saint Jean Soleymieux (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 570 days.

(21) Appl. No.: 14/130,761

(22) PCT Filed: Jul. 4, 2012

(86) PCT No.: PCT/EP2012/063063
§ 371 (c)(1),
(2), (4) Date: May 19, 2014

(87) PCT Pub. No.: WO2013/004762
PCT Pub. Date: Jan. 10, 2013

(65) Prior Publication Data
US 2014/0247066 A1 Sep. 4, 2014

(30) Foreign Application Priority Data
Jul. 4, 2011 (FR) ..................................... 11 56012

(51) Int. Cl.
*G01R 31/02* (2006.01)
*G01R 31/40* (2014.01)
(Continued)

(52) U.S. Cl.
CPC ......... *G01R 31/405* (2013.01); *G01R 31/025* (2013.01); *G01R 31/129* (2013.01);
(Continued)

(58) Field of Classification Search
USPC ... 324/761.01, 762.07, 537, 536, 76.11, 426, 324/522; 435/68.1, 188; 307/82
See application file for complete search history.

(56) References Cited

U.S. PATENT DOCUMENTS 4,736,267 A  4/1988  Karlmann et al.
4,937,697 A  6/1990  Edwards et al.
(Continued)

FOREIGN PATENT DOCUMENTS

CN  1129809 A  8/1996
CN  101246195 A  8/2008
(Continued)

OTHER PUBLICATIONS

Combined Chinese Office Action and Search Report issued Jun. 1, 2015 in Patent Application No. 201280033220.3 (with English language translation).
(Continued)

*Primary Examiner* — Melissa Koval
*Assistant Examiner* — Nasima Monsur
(74) *Attorney, Agent, or Firm* — Oblon, McClelland, Maier & Neustadt, L.L.P.

(57) ABSTRACT

A method for detecting a series arc in a photovoltaic device, operating in direct current mode, including N (N=1 or N>1) photovoltaic modules, connected to a charging device having a capacitive behavior for the modules, the method including: a) detecting, across n of the N modules (1≤n≤N), time evolution of voltage; b) identifying a voltage variation between a first zone of stable voltage and a second zone of stable voltage for a duration of at least 5 µs, which immediately follows the voltage variation; and c) determining whether the voltage variation is between a value Vmin higher than or equal to 0.2 V and a value Vmax lower than or equal to 20 V, with rise time of the variation between a duration Tmin higher than or equal to 0.5 µs and a duration Tmax lower than or equal to 5 µs.

20 Claims, 4 Drawing Sheets

(51) Int. Cl.
  *G01R 31/12* (2006.01)
  *H02H 1/00* (2006.01)
  *H02S 50/10* (2014.01)
(52) U.S. Cl.
  CPC ....... *G01R 31/1272* (2013.01); *H02H 1/0015* (2013.01); *H02S 50/10* (2014.12)

(56) References Cited

U.S. PATENT DOCUMENTS

| | | |
|---|---|---|
| 5,452,223 A | 9/1995 | Zuercher et al. |
| 5,561,605 A | 10/1996 | Zuercher et al. |
| 5,726,505 A | 3/1998 | Yamada et al. |
| 5,914,590 A | 6/1999 | Wacknov et al. |
| 5,939,871 A | 8/1999 | Tanaka |
| 6,111,767 A | 8/2000 | Handleman |
| 6,339,538 B1 | 1/2002 | Handleman |
| 6,469,487 B2 | 10/2002 | Ewert et al. |
| 6,504,692 B1 | 1/2003 | Macbeth et al. |
| 6,683,766 B1 | 1/2004 | Guo et al. |
| 7,233,135 B2 | 6/2007 | Noma et al. |
| 7,453,308 B2 | 11/2008 | Tihanyi |
| 7,817,391 B2 | 10/2010 | Kimber |
| 8,570,017 B2 | 10/2013 | Perichon et al. |
| 8,576,520 B2 | 11/2013 | Pamer |
| 8,924,169 B1 | 12/2014 | Ledenev et al. |
| 2006/0198167 A1 | 9/2006 | Nakamura |
| 2006/0256492 A1 | 11/2006 | Zhao et al. |
| 2007/0133135 A1 | 6/2007 | Kilroy et al. |
| 2007/0208981 A1* | 9/2007 | Restrepo ............... H02H 3/334 714/731 |
| 2008/0094867 A1 | 4/2008 | Muller et al. |
| 2008/0180866 A1 | 7/2008 | Wong |
| 2008/0197854 A1 | 8/2008 | Valcore et al. |
| 2010/0085669 A1 | 4/2010 | Rivers |
| 2010/0164459 A1* | 7/2010 | Perichon ............... H02H 3/08 323/284 |
| 2011/0019444 A1 | 1/2011 | Dargatz et al. |
| 2011/0141644 A1* | 6/2011 | Hastings ........... H01L 31/02021 361/93.2 |
| 2012/0053867 A1 | 3/2012 | Dunn et al. |
| 2012/0118348 A1 | 5/2012 | Buller |
| 2012/0134058 A1* | 5/2012 | Pamer ............... G01R 31/1227 361/42 |
| 2012/0174961 A1 | 7/2012 | Larson et al. |
| 2012/0206843 A1 | 8/2012 | Dargatz et al. |
| 2013/0307556 A1 | 11/2013 | Ledenev et al. |
| 2014/0055900 A1 | 2/2014 | Luebke et al. |
| 2014/0142874 A1 | 5/2014 | Martin et al. |
| 2014/0373894 A1 | 12/2014 | Stratakos et al. |
| 2016/0181799 A1 | 6/2016 | Kanemaru et al. |
| 2016/0218669 A1 | 7/2016 | Chaintreuil et al. |
| 2016/0276977 A1 | 9/2016 | Chaintreuil et al. |

FOREIGN PATENT DOCUMENTS

| | | |
|---|---|---|
| DE | 3429469 A1 | 2/1986 |
| EP | 1 463 188 B1 | 9/2004 |
| EP | 1463188 B1 | 9/2004 |
| EP | 1 796 238 | 6/2007 |
| EP | 1 796 238 B1 | 1/2013 |
| FR | 2 912 848 A1 | 8/2008 |
| FR | 2965626 A1 | 4/2012 |
| FR | 2965627 A1 | 4/2012 |
| FR | 2965628 A1 | 4/2012 |
| JP | 5-284654 A | 10/1993 |
| JP | 5-343722 A | 12/1993 |
| JP | 7-44262 | 2/1995 |
| JP | 10-289025 A | 10/1998 |
| JP | 11-579 | 1/1999 |
| JP | 11-214735 | 8/1999 |
| JP | 11-312022 | 11/1999 |
| WO | WO 95/25374 | 9/1995 |
| WO | WO 98/44398 A1 | 10/1998 |
| WO | WO 2006/029360 A1 | 3/2006 |
| WO | WO 2008/125915 A2 | 10/2008 |
| WO | WO 2010/072717 A1 | 7/2010 |
| WO | WO 2011/011711 A2 | 1/2011 |
| WO | 2011 017721 | 2/2011 |
| WO | WO 2011/022340 A2 | 2/2011 |
| WO | WO 2012/012486 | 1/2012 |

OTHER PUBLICATIONS

International Search Report Issued Nov. 5, 2012 in PCT/EP12/63063 Filed Jul. 4, 2012.

French Preliminary Search Report issued Mar. 15, 2012 in Patent Application No. FR 1156012 (with English Translation of Category of Cited Documents).

Fritz Schimpf, et al., "Recognition of Electric Arcing in the DC-wiring of Photovoltaic Systems", Telecommunications Energy Conference, IEEE, (Oct. 18, 2009), 6 pages.

Richard Mehl, et al., "High Voltage DC Protection of High Voltage DC Next Generation Smart Datacom Power Distribution with Solid State Hybride Circuit Breakers and Arc Fault Detection Modules (AFDM)", Telecommunications Energy Conference, IEEE, XP32276433, (Sep. 30, 2012), 6 pages.

Thomas J. Schoepf, et al. "Mitigation and Analysis of Arc Faults in Automotive DC Networks," IEEE Transactions on Components and Packaging Technologies, vol. 28, No. 2, Jun. 2005, pp. 319-326.

Von George Bopp, "Elektrische Sicherheit in Photovoltaik-Anlagen" Forschungverund Sonnenenergie: Themen 99/93 (w/English abstract) pp. 62-68.

Fritz Schimpf, et al. "Recognition of Electric Arcing in the DC-wiring of Photovoltaic Systems," Telecommunications Energy Conference, pp. 1-6, Oct. 18, 2009, XP031579534.

Office Action dated Apr. 12, 2017 in U.S. Appl. No. 14/915,370.
Office Action dated Apr. 6, 2017 in U.S. Appl. No. 14/915,504.

* cited by examiner

DETECTION OF ELECTRICAL ARCS IN PHOTOVOLTAIC EQUIPMENT

TECHNICAL FIELD AND PRIOR ART

This invention relates to photovoltaic facilities and, in particular, means for detecting electric arcs in these facilities.

Facilities using photovoltaic panels (PV) are likely to be developed. But this kind of device ages and failures can occur over time. These can be benign (for example: shutdown, production loss, decrease in efficiency . . . ) but can also be more serious if a series electric arc appears on a connection. Indeed, the consequence of such a phenomenon can be, at worst, a fire outbreak that could even result in the destruction of the building wherein a PV module is installed.

Figure 1A:
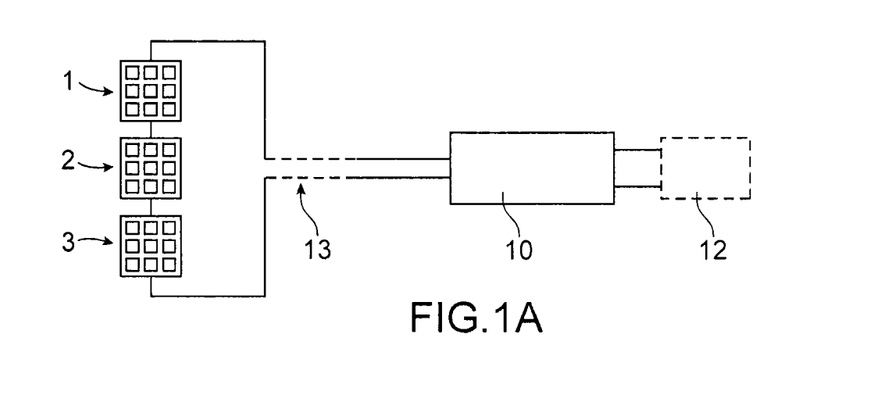
FIG. 1A represents the location of an arc in a system of a known type.

FIG. 1A represents the location of an arc in a system of a known type, including 3 photovoltaic modules 1, 2, 3 and a converter (or inverter) 10, connected to the power grid 12. It is in a zone 13, between the photovoltaic modules 1, 2, 3 and the inverter 12, that a series arc can occur. Electric arcs can also occur within the modules or between the modules.

It is thus attempted to develop systems enabling electric arcs to be detected as soon as they arise, in order to stop them and very strongly restrict their influence onto the facility and its surroundings.

Known solutions for detecting electric arcs in direct or alternating current low voltage facilities are mainly based on a ultrasonic detection (by acoustic signature of the arc) or radiofrequency (by RF signature of the arc) or even on heat measurements (infrared signature of the arc). The signature of a phenomenon is all the characteristics and theirs values which enable it to be certainly identified.

For PV facilities, the same kind of detector starts to be developed by some laboratories or industries. The main constraint of these systems lies in their means for measuring the signature. Indeed, since the signatures are complex and generally at high frequencies (for acoustic and RF signatures) they require a very heavy software processing, with a high sampling, and thus expensive components. Moreover, the processing time, including a discrimination of the noise or disturbances from the signature of the arc, can be long, ranging from a few seconds to a few minutes.

These solutions therefore do not fulfil a need for a quick, reliable and low cost securement.

Document FR 2912848 describes how to use the measurement of a quick variation in the voltage to detect a series electric arc. It is this variation which is attempted to be finely evaluated.

Document WO 2011/17721 describes a method for detecting electric arcs in a PV system. This detection is based on an average current measurement and the evolution of which is observed.

This solution requires a lengthy measurement and a lengthy processing.

DISCLOSURE OF THE INVENTION

There is described a measurement of the voltage and the detection of the characteristic signature of the electric arc in a photovoltaic system, in direct current, to perform a quick reliable detection.

More particularly, it is described a method for detecting a series arc in a photovoltaic device, operating in direct current mode, including N (N=1 or N>1) photovoltaic modules (100, 1, 2, 3), connected to a charging device (10) having a capacitive behaviour for the modules, this method including:

a) detecting, across n of the N modules (1≤n≤N), the time evolution of the voltage, b) identifying a voltage variation between a first zone (A) of stable voltage and a second zone (B) of stable voltage for a duration of at least 5 µs, which immediately follows said voltage variation, and c) determining whether the voltage variation is between a value Vmin higher than or equal to 0.2 V and a value Vmax lower than or equal to 20 V, with a rise time of this variation between a duration Tmin higher than or equal to 0.5 µs and a duration Tmax lower than or equal to 5 µs.

Step c) can be performed in all or in part by analysing or calculating the slope of the voltage variation and by determining whether this slope is between Vmin/Tmax (0.04 V/µs) and Vmax/Tmin (40 V/µs).

The step of detecting a) can be performed across the assembly of the N photovoltaic modules. It can then be considered that the value Vmin is higher than or equal to 10 V and the value Vmax is lower than or equal to 20 V.

The materials making up the connections of the photovoltaic modules define an arc voltage value VARC. In this method, the values Vmin and Vmax can be positioned on either side of this arc voltage value VARC predefined for the materials under consideration.

The durations Tmin and Tmax can be positioned on either side of a duration Tarc corresponding to the duration enabling a voltage variation to be applied across the assembly of the photovoltaic modules which is equal to VARC.

The step of detecting a) can be performed across a subassembly of n of the N photovoltaic modules.

In this case, the values Vmin and Vmax can be positioned on either side of a value VARC*n/N, VArc corresponding to the arc voltage predefined for the materials making up the connections of the photovoltaic modules under consideration, the value Vmax being lower than or equal to 20V*n/N.

The durations Tmin and Tmax are preferably positioned on either side of a duration Tarc*n/N, with Tarc corresponding to the duration enabling a voltage variation to be applied across the assembly of the photovoltaic modules which is equal to VARC, Tarc*n/N being lower than or equal to 5*nN µs.

The measured voltages can be digitized, steps a) to c) being performed from the digital values of the voltages.

There is also described a device for detecting a series arc in a photovoltaic device, operating in direct current mode, including N (N=1 or N>1) photovoltaic modules, and a device having a capacitive behaviour for the modules, this detecting device including:

a) means for detecting, across n of the N modules, the time evolution of the voltage, b) means for identifying a voltage variation between a first zone (A) of stable voltage and a second zone (B) of stable voltage for a duration of at least 5 µs, which immediately follows said voltage variation, c) means for determining whether the voltage variation is between a value Vmin higher than or equal to 0.2 V and a value Vmax lower than or equal to 20 V, with a rise time of this variation between a duration Tmin higher than or equal to 0.5 µs and a duration Tmax lower than or equal to 5 µs.

The means determining whether the voltage variation is between Vmin and Vmax, and whether the rise time is between Tmin and Tmax can analyse or calculate or measure the slope of the voltage variation and determine whether this slope is between Vmin/Tmax (0.04 V/µs) and Vmax/Tmin (40 V/µs).

The time evolution of the voltage can be detected across the assembly of the N photovoltaic modules, the value Vmin being higher than or equal to 10 V and the value Vmax being lower than or equal to 20V.

Preferably, the values Vmin and Vmax are positioned on either side of an arc voltage value VARC predefined for the materials making up the connections of the photovoltaic modules under consideration.

The durations Tmin and Tmax can be positioned on either side of a duration Tarc corresponding to the duration required for applying a voltage variation across the assembly of the photovoltaic modules which is equal to VARC.

The time evolution of the voltage can be detected across a subassembly of n of the N photovoltaic modules.

The values Vmin and Vmax can then be positioned on either side of an value VARC*n/N, VArc corresponding to an arc voltage predefined for the materials making up the connections of the photovoltaic modules under consideration, the value Vmax being lower than or equal to 20V*n/N. The durations Tmin and Tmax can be positioned on either side of a duration Tarc*n/N, with Tarc corresponding to the duration required for applying a voltage variation across the assembly of the photovoltaic modules which is equal to VARC, Tarc*n/N being lower than or equal to 5*nN µs.

Such a device can include means for filtering frequencies at least equal to 100 Hz.

It can include filtering means forming a passive filter or forming an active filter and/or analog and/or digital filtering means.

Means can also be provided to digitize the measured voltages.

The device or means having a capacitive behaviour for the modules can include a converter or inverter or battery.

DETAILED DISCLOSURE OF PARTICULAR EMBODIMENTS

Figure 1B:
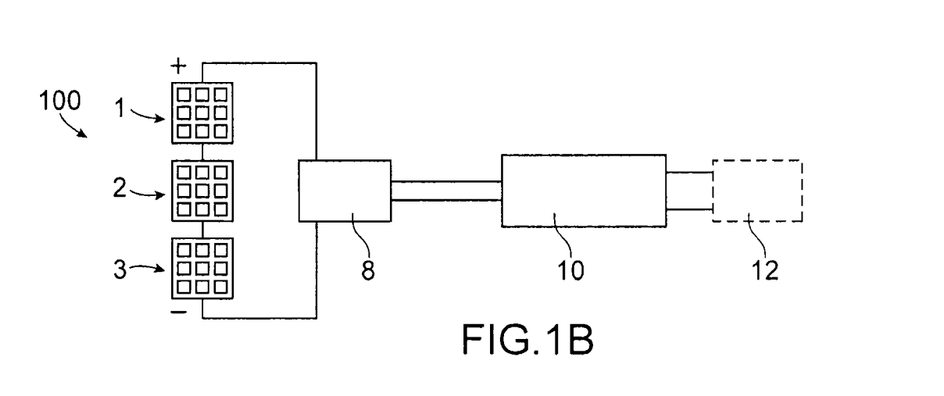
FIGS. 1B and 1C schematically represent a general structure of a photovoltaic facility, with arc detection means, positioned between a photovoltaic module and a converter (FIG. 1B), or between modules (FIG. 1C)

FIG. 1B schematically represents the structure of a photovoltaic facility, including 3 photovoltaic modules 1, 2, 3, arc measuring means 8, and an element 10 imposing a capacitive charge to the output of the facility, or even having a capacitive behaviour for the modules, such a converter or inverter or battery.

This element 10 is connected to the power grid 12. It is between the photovoltaic modules 1, 2, 3 and/or this element 10 that an arc can occur. Or, the arc can occur between the PV modules or in the PV modules, that is between the cells of a PV module.

By photovoltaic module, it is meant a monolithic assembly of photovoltaic cells.

The present description is not restricted to three photovoltaic modules, but is applicable to any number N of these modules. In the following text, the assembly of the photovoltaic modules will be designated by the single reference numeral 100.

Figure 1C:
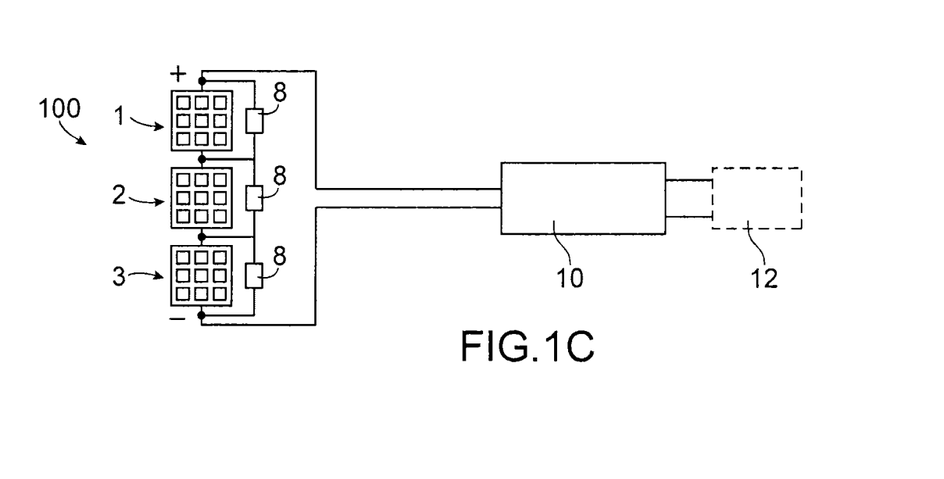

The arc measuring means 8 are placed between the photovoltaic modules 100 and the means 10. They enable the voltage of the group of photovoltaic modules to be measured. If one wishes is detect the electric arcs in the modules or between the modules of a series of modules, measuring means 8 are placed across each module 1, 2, 3 of this series of modules, as illustrated in FIG. 1C. There can also be a measurement across a series of n modules (1≤n≤N).

Thanks to their input capacitance, or to their input charge having a capacitive nature, the means 10 enable, for the duration for establishing an arc, a stable voltage to be kept at the output of the string of PV modules 100. As already set out above, alternatively, an inverter, or a capacitive charge such as a converter or a battery can be provided, which will allow the same stabilizing effect.

The voltage and current fed by the photovoltaic modules depend on several parameters (sunshine, temperature) and can vary significantly.

Figure 6:
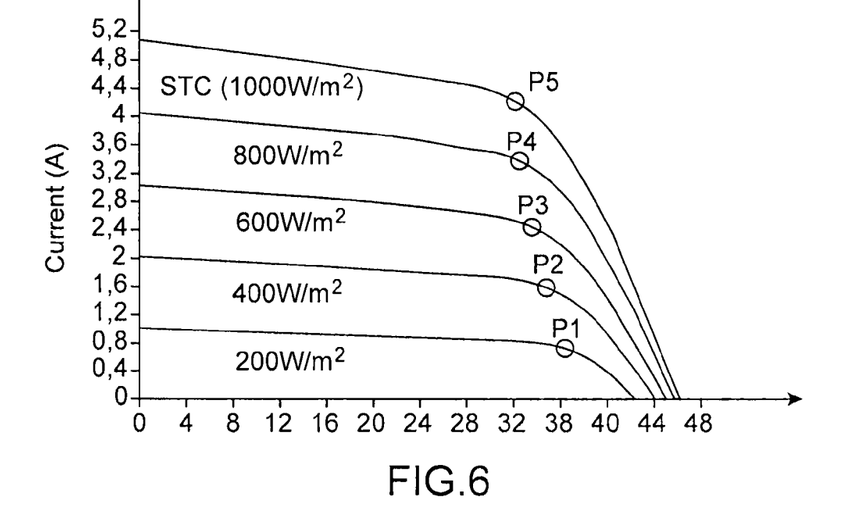
FIG. 6 represents characteristic current/voltage curves of a photovoltaic module.

FIG. 6 shows characteristic curves of a photovoltaic module as a function of the received illumination (from 200 to 1000 W/cm$^2$). The current fed by the module strongly varies as a function of this illumination (proportionally in a first approximation). The operating points P1, P2, ... Pk on the curves of FIG. 6 are points where the module delivers the maximum power for a given illumination.

In order to optimize the energy production, the converter or inverter 10 imposes an operating voltage such that they produce the maximum power (this function is called Maximum Power Point Tracking (MPPT).

The means 8 enable, in the measurement of the voltage, a characteristic signature of an electric arc to be identified, which is expressed in a quick rise of the voltage across the PV device 100. This variation expressed by an evolution of the instantaneous voltage $V_i$, which has strong oscillations and which can take the form represented in FIG. 2. Also represented is the voltage $V_f$, which results from filtering the instantaneous voltage $V_i$. It is noted that these voltage variations occur between a $1^{st}$ voltage stability zone (Zone A in FIG. 2), at a voltage value $V_0$ called an initial value, and a $2^{nd}$ voltage stability zone (zone B in FIG. 2), at a voltage value $V_1$ called a final value. This $2^{nd}$ stability zone has a duration of at least a few µs, for example at least 5 µs or at least 10 µs. Consequently, the variation which results from the voltage edge varies the voltage value.

Figure 2:
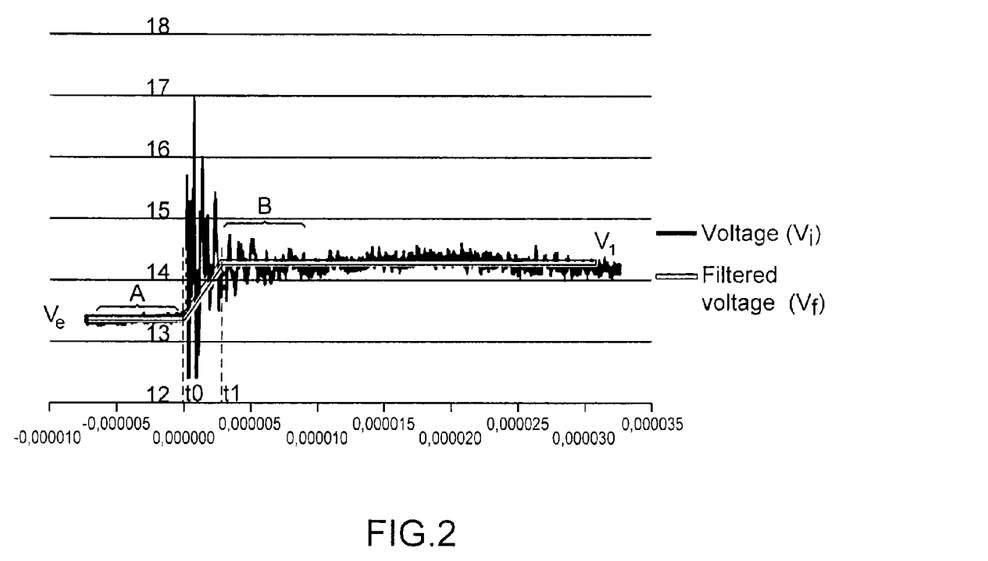
FIG. 2 represents the variation of a voltage, over time, during an electric arc across a photovoltaic device.

After the rising edge, the voltage is set at the final value $V_1$ of the voltage edge equal to about $V_0$+VARC, and remains substantially at this value for the minimum duration indicated above.

The voltage oscillations observed at the beginning of the edge of the instantaneous voltage $V_i$ can vary. The signature is characterised, between the $1^{st}$ voltage stability zone and the $2^{nd}$ voltage stability zone, by a positive change ΔV (=V1−V0) of the voltage $V_i$ (but also of Vg, since the same is directly deduced from $V_i$, by smoothing the curve $V_i$) by a value between 0.2 V and 20 V.

This value is variable according to the measurement place and the number of PV modules which are located in the string of PV modules 100 where the arc detector is situated, as explained herein below.

The maximum value of $\Delta V$ ie 20 V is related to the physical characteristics of an electric arc. Indeed, as incidentally already explained in Document FR 2 912 848, an electric arc can be decomposed into 3 zones:

1 electrode/air interface zone
1 plasma zone
1 air/electrode interface zone.

The two interface zones appear as a PN junction of a diode, that is a junction between a conducting material and an isolator.

This junction thus has a fixed potential which is directly related to the potentials of the materials present. That of air does not vary, however that of the electrode can vary according to whether the electrode is of copper, or aluminium, or silver . . . . This potential is thus present at each interface and is characteristic of the arc. It occurs as soon as priming appears (before the plasma is established) and its maximum value, measured across the arc, is between 10 V and 20 V.

This measured value is different depending on the location of the arc detector 8. It has a maximum value of 10 V to 20 V at the front of a photovoltaic facility (with a measurement between the positive terminal+ of module 1 and the negative terminal of module n).

If the arc detector is located across either of modules 1, 2, 2, . . . or N, the value of the voltage seen by the arc detector is divided by a factor equal to N (+/−5%) where N is the number of PV modules in the PV string.

Taking again the notations already used above, the voltage measured at a single module of the string will vary at the end of an arc establishment, by VARC/N (+/−5%) where N is the number of PV modules in the string. Indeed, if the voltage variation across the assembly is VARC, this variation will be distributed on each of the N modules. If the voltage is measured across an assembly of n modules from the N modules of the string, it will have a variation of n×VARC/(N).

Another parameter of a series electric arc occurring in a photovoltaic system is the rise time $\Delta T$ of the voltage edge of the electric arc (from $t_0$ to $t_1$ on curve II of FIG. 2), which is measured between the initial value $V_0$ of the voltage and the final value $V_1$ (of Vf), with a margin of error, for example more or less 10%, this margin of error being due to the noise on the wave form. This rise time is related to the physical characteristics of the photovoltaic modules and their dynamic behaviour. A PV module represents some variable stray capacitance or equivalent value. It thus has a response time to a voltage step characteristic thereof. But this time scarcely varies depending on the different technologies of PV modules; it is between 0.5 μs and 5 μs.

As for the voltage variation, this rise time value is divided by the number of modules when the voltage is measured across a single module of the string. Across an assembly on n modules from an assembly of N modules, it will be n×ΔT/N.

These specificities enable the identification, between 2 voltage stability zones, of the signature of a series electric arc, characteristic of the medium of a PV system, using the identified voltage variation $\Delta V$ and the rise time value $\Delta T$.

Similarly or equivalently, an arc can be identified:
 by the duration $\Delta T$ and the slope of the voltage variation during its time evolution;
 by the voltage variation $\Delta V$ and the slope of the voltage variation during its time evolution.

The presence of an arc is expressed:
 by a maximum voltage variation between 10 V and 20 V (if the measurement is made across the assembly of the modules), with a rise time between 0.5 μs and 5 μs;
 or by a slope of the voltage edge between 40 V/μs or 0.04 V/μs, with a rise time between 0.5 μs and 5 μs;
 or by a slope of the voltage edge between 40 V/μs or 0.04 V/μs, or by a maximum voltage variation between 10 V and 20 V (if the measurement is made across the assembly of the modules).

In other words, it is determined, in either way, whether the voltage variation is between a value Vmin higher than or equal to 0.2 V and a value Vmax lower than or equal to 20 V, with a rise time of this variation between a duration Tmin higher than or equal to 0.5 μs and a duration Tmax lower than or equal to 5 μs.

If the measurement or detection is performed across the assembly of the N photovoltaic modules, the value Vmin is higher than or equal to 10 V and the value Vmax lower than or equal 20 V.

The above values are suitable when the measurement is performed across a single module or an assembly of n modules from the N modules; but the values of the variation slope or the voltage edge remains the same in both cases.

Thus, if the step of detection is performed across a subassembly n of the N photovoltaic modules, a value Vmax can be considered lower than or equal to 20V*n/N, Tarc*n/N being lower than or equal to 5*n/N μs.

Exemplary embodiments of a device for detecting an arc implement technical means enabling the signal to be acquired and a signature of the type described above to be discriminated.

For this, several technical solutions are possible.

Each of the solutions proposed above attempts to isolate the signature of the electric arc from other disturbances of the voltage which are observed at the input of the means 8 forming an arc detector. Indeed, on a PV system, the voltage is not perfectly smooth, there remain disturbances, in particular at 100 Hz, having a sinusoidal shape and variable amplitude depending on the power level injected by the inverter 10 on the grid: these are harmonics generated by the inverter, which are applied at the input thereof and thus on the D-C part of the PV facility. Some disturbances can be at a higher frequency, for example Dirac type disturbances, which represent engine start disturbances or any other element close to the PV facility and emitting electromagnetic disturbances. For example, an engine can be located in an environment close to the PV facility and emit a disturbing electromagnetic field or be powered by the output of the inverter.

Finally, disturbances related to the use of a communication by power line carrier (PLC) can disturb the arc detector. These can come from, for example, the presence, in the PV facility, of smart systems communicating by power line carrier (PLC).

Figure 3:
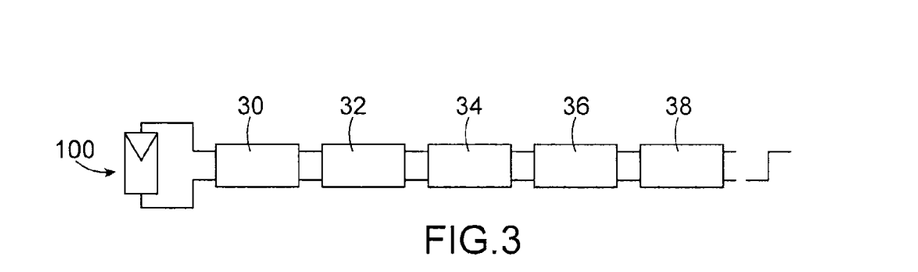
FIG. 3 represents an embodiment of the device according to the invention.

A first exemplary embodiment consists in using cascade analog passive filters, as illustrated in FIG. 3. It includes 3 stages: a $1^{st}$ passive filter 30 (band-pass), a $2^{nd}$ passive filter 32 (high-pass) and an amplifier 34.

These stages can be gathered as a single one. In FIG. 3, these stages can be followed by a buffer 36 and decoupling means 38 for decoupling the PV module from the electrical circuit in order to secure it. The buffer enables the rebounds of the measured signal to be filtered. An electric arc is rarely distinct and consists of a multitude of primings before its plasma is stabilized: it is advisable to detect only the first priming.

The filters 30, 32 enable the right frequency to be isolated (with the characteristic time of front rise between 0.5 µs and 2 µs) and thus the low frequencies (below 1000 Hz) and high frequencies to be rejected.

Figure 4:
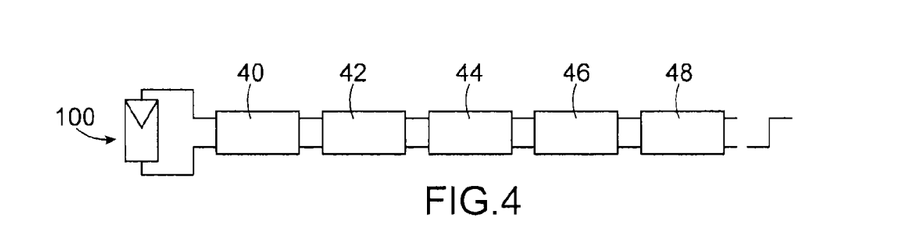
FIG. 4 represents another embodiment of the device according to the invention.

As illustrated in FIG. 4, this filtering can also be performed with active elements enabling the selectivity thereof to be increased (order 6 instead of order 1 or 2 with the passive filtering). This device illustrated in FIG. 4 includes:
means 40 forming an active filter (high-pass),
means 42 forming an amplifier and a comparator, means 44 forming a passive filter (low-pass),
means 44 forming a passive filter (low-pass),
a buffer 46,
and decoupling means 48.

Figure 5:
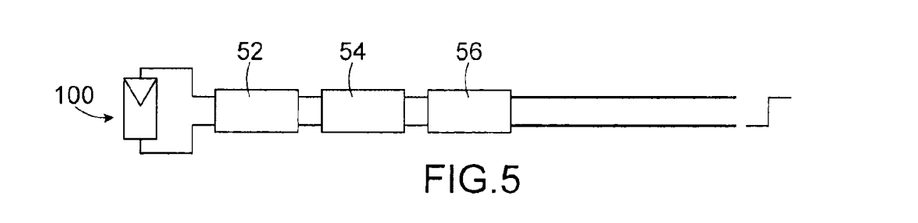
FIG. 5 represents still another embodiment of the device according to the invention.

Finally, a combination of analog means and digital means is possible, as illustrated in FIG. 5, including:
decoupling means 52,
means 54 forming an amplifier and a comparator,
digital processing means 56.

Other embodiments are possible, for example the amplification and comparison functions are not necessarily in a same device 54.

Basically, the more an analog system is favoured, the quicker the response time of the device. It is interesting to have a quick response time (a few tens microseconds) because it is thus possible to restrict the occurrence of the arc plasma, thus avoiding physical degradations to the system. The more reduced the number of components to perform a function, the more reduced the cost, hence the point of only working on the voltage and analog signature (not in current or RF and with a heavy digital processing accordingly).

In the various devices described, the voltage and the corresponding rise time are detected, in accordance with one of the above described methods, and particularly:
thanks to the comparator, a maximum voltage variation between 0.2 V and 20 V,
thanks to the selectivity of the filters, a rise time of this variation between 0.5 µs and 5 µs.

Figure 7:
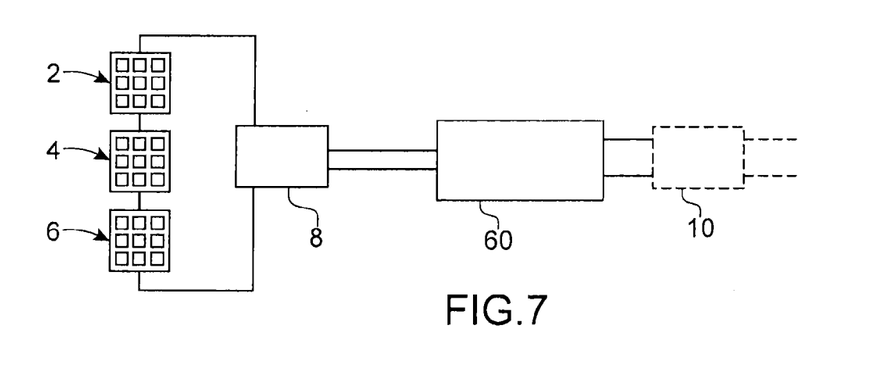
FIG. 7 represents a digital embodiment of a device according to the invention.

Another embodiment is illustrated in FIG. 7: this is a digital mode, using an acquisition string and an analog/digital converter 60 which enables the signature to be differentiated from the other ambient noises. This digital embodiment does not require filtering. Preferably, the converter 60 enables the signal to be sampled at a frequency equal to 4 MHz or 5 MHz. Digital processing means enable the different values to be calculated and the processing steps according to the invention to be implemented.

The invention claimed is:

1. A method for detecting a series arc in a photovoltaic device, operating in direct current mode, including N (N=1 or N>1) photovoltaic modules, connected to a charging device having a capacitive behavior for the modules, the method comprising:
a) detecting, across n of the N modules ($1 \leq n \leq N$), a time evolution of a voltage;
b) identifying a voltage variation between a first zone of stable voltage and a second zone of stable voltage for a duration of at least 5 µs, which immediately follows the voltage variation; and
c) detecting said arc by determining whether the voltage variation is between a value Vmin higher than or equal to 0.2 V and a value Vmax lower than or equal to 20 V, with a rise time of the variation between a duration Tmin higher than or equal to 0.5 us and a duration Tmax lower than or equal to 5 µs.

2. The method according to claim 1, wherein the determining c) is performed in all or in part by analysing the slope of the voltage variation by determining whether the slope is between Vmin/Tmax (0.04 V/µs) and Vmax/Tmin (40 V/µs).

3. The method according to claim 1, wherein the detecting a) is performed across an assembly of the N photovoltaic modules, the value Vmin being higher than or equal to 10 V and the value Vmax being lower than or equal to 20 V.

4. The method according to claim 1, wherein:
the values Vmin and Vmax are positioned on either side of an arc voltage value VARC predefined for materials making up connections of the photovoltaic modules under consideration, and
the durations Tmin and Tmax are positioned on either side of a duration Tarc corresponding to the duration required for applying a voltage variation across an assembly of the photovoltaic modules which is equal to VARC.

5. The method according to claim 1, wherein the detecting a) is performed across a subassembly n of the N photovoltaic modules.

6. The method according to claim 5, wherein:
the values Vmin and Vmax are positioned on either side of a value VARC*n/N, VArc corresponding to an arc voltage predefined for materials making up connections of the photovoltaic modules under consideration, the value Vmax being lower than or equal to 20V*n/N, and
the durations Tmin and Tmax are positioned on either side of a duration Tarc*n/N, with Tarc corresponding to the duration required for applying a voltage variation across the assembly of the photovoltaic modules which is equal to VARC, Tarc*n/N being lower than or equal to 5*nN µs.

7. The method according to claim 5, wherein a passive or active filtering is performed using analog or digital means.

8. The method according to claim 1, wherein any measured voltages are digitized, and steps a) to c) are performed from digital values of the measured voltage.

9. The method according to claim 1, wherein the charging device includes a converter or an inverter or a battery.

10. A device for detecting a series arc in a photovoltaic device, operating in direct current mode, including N (N=1 or N>1) photovoltaic modules, and a device having a capacitive behavior for the modules, the detecting device comprising:
a) a detector which detects, across n of the N modules, a time evolution of a voltage;
b) a voltage variation identification circuit which identifies a voltage variation between a first zone of stable voltage and a second zone of stable voltage for a duration of at least 5 µs, which immediately follows the voltage variation;
c) a voltage comparator circuit which detects said arc by determining whether the voltage variation is between a value Vmin higher than or equal to 0.2 V and a value Vmax lower than or equal to 20 V, with a rise time of the variation between a duration Tmin higher than or equal to 0.5 µs and a duration Tmax lower than or equal to 5 µs.

11. The device according to claim 10, wherein the voltage comparator circuit determines whether the voltage variation is between Vmin and Vmax, and whether the rise time is between Tmin and Tmax by analysing the slope of the voltage variation determining whether the slope is between Vmin/Tmax (0.04 V/µs) and Vmax/Tmin (40 V/µs).

12. The device according to claim 10, wherein the detector detects the time evolution of the voltage across an assembly of the N photovoltaic modules, the value Vmin being higher than or equal to 10 V and the value Vmax being lower than or equal to 20 V.

13. The device according to claim 10, wherein:
the values Vmin and Vmax are positioned on either side of an arc voltage value VARC predefined for materials making up connections of the photovoltaic modules under consideration, and
the durations Tmin and Tmax are positioned on either side of a duration Tarc corresponding to the duration required for applying a voltage variation across an assembly of the photovoltaic modules which is equal to VARC.

14. The device according to claim 10, wherein the detector detects the time evolution of the voltage across a sub-assembly of n of the N photovoltaic modules.

15. The device according to claim 10, wherein:
the values Vmin and Vmax are positioned on either side of a value VARC*n/N, VArc corresponding to an arc voltage predefined for materials making up connections of the photovoltaic modules under consideration, the value Vmax being lower than or equal to 20V*n/N, and
the durations Tmin and Tmax are positioned on either side of a duration Tarc*n/N, with Tarc corresponding to the duration required for applying a voltage variation across an assembly of the photovoltaic modules which is equal to VARC, Tarc*n/N being lower than or equal to 5*nN μs.

16. The device according to claim 10, further comprising a filter which filters frequencies at least equal to 100 Hz.

17. The device according to claim 10, further comprising a passive filter or an active filter.

18. The device according to claim 10, further comprising at least one of an analog filter and a digital filter.

19. The device according to claim 10, further comprising a voltage digitizer which digitizes any measured voltages.

20. The device according to claim 10, further comprising a converter or an inverter or a battery.

* * * * *